(12) United States Patent
Kim et al.

(10) Patent No.: US 11,626,453 B2
(45) Date of Patent: Apr. 11, 2023

(54) COLOR FILTER, AND METHOD OF MANUFACTURING SAME

(71) Applicant: DONGWOO FINE-CHEM CO., LTD., Jeollabuk-do (KR)

(72) Inventors: Hun-Sik Kim, Incheon (KR); Seul-Ki Park, Gyeonggi-do (KR); Jong-Soo Lee, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 202 days.

(21) Appl. No.: 16/550,880

(22) Filed: Aug. 26, 2019

(65) Prior Publication Data
US 2020/0066803 A1    Feb. 27, 2020

(30) Foreign Application Priority Data
Aug. 27, 2018   (KR) .......................... 10-2018-0100518

(51) Int. Cl.
| | | |
|---|---|---|
| *H01L 27/32* | (2006.01) | |
| *G02B 5/22* | (2006.01) | |
| *H01L 51/56* | (2006.01) | |
| *H01L 51/52* | (2006.01) | |

(52) U.S. Cl.
CPC .............. *H01L 27/322* (2013.01); *G02B 5/22* (2013.01); *H01L 51/5268* (2013.01); *H01L 51/56* (2013.01); *H01L 2251/5369* (2013.01); *H01L 2251/558* (2013.01)

(58) Field of Classification Search
CPC ... H01L 27/322; H01L 51/56; H01L 51/5268; H01L 2251/558; H01L 2251/5369; G02B 5/22; G02B 5/286; G02B 5/20; B41M 3/003; B41M 5/0047; G03F 7/0007
See application file for complete search history.

(56) References Cited

U.S. PATENT DOCUMENTS

| | | | |
|---|---|---|---|
| 2017/0255054 A1 | 9/2017 | Li | |
| 2017/0261849 A1 | 9/2017 | Tang | |
| 2018/0029072 A1* | 2/2018 | Li | ............ G02B 5/201 |
| 2018/0031910 A1 | 2/2018 | Li | |
| 2018/0074401 A1 | 3/2018 | Nam | |
| 2018/0284613 A1* | 10/2018 | Hirayama | ............. G03F 7/0048 |
| 2018/0374409 A1* | 12/2018 | Lee | ....................... G09G 3/3225 |

(Continued)

FOREIGN PATENT DOCUMENTS

| | | |
|---|---|---|
| JP | 2018067644 A | 4/2016 |
| JP | 2017094818 A | 6/2017 |

(Continued)

*Primary Examiner* — Kevin Quarterman
(74) *Attorney, Agent, or Firm* — Wells St. John P.S.

(57) ABSTRACT

The present invention relates to a color filter including a color layer having at least one color, a quantum dot layer, and a partition wall in a unitary form for the color layer and the quantum dot layer, a method of manufacturing the color filter, and an image display device including the color filter. The color filter is capable of exhibiting a superior external light suppression effect, thereby improving luminous efficiency, and moreover, it is possible to simplify the process of manufacturing the color filter, thereby improving productivity. In addition, the image display device including the color filter can exhibit improved luminance to thus realize a high-quality image.

16 Claims, 3 Drawing Sheets

(56) References Cited

U.S. PATENT DOCUMENTS

2019/0157354 A1* 5/2019 Lee .................... H01L 33/501
2019/0390076 A1* 12/2019 Isonaka ................ C09D 11/38

FOREIGN PATENT DOCUMENTS

| | | | |
|---|---|---|---|
| JP | 2017117485 A | | 6/2017 |
| JP | 2018-25802 | | 2/2018 |
| JP | 2018-132662 A | | 8/2018 |
| JP | 2018132662 A | * | 8/2018 |
| JP | 2018189920 A | | 11/2018 |
| JP | 2019000801 A | | 1/2019 |
| JP | 2019179111 A | | 10/2019 |
| KR | 10-12091281 | | 11/2012 |
| KR | 10-2016-0056335 | | 5/2016 |
| KR | 10-2017-0081765 | | 6/2017 |
| KR | 20170061765 A | | 8/2017 |
| KR | 10-2017-0110950 | | 10/2017 |
| KR | 10-2017-0123600 | | 11/2017 |
| KR | 10-2018-0018945 | | 2/2018 |
| KR | 10-2018-0030353 | | 3/2018 |
| KR | 201825649 | | 7/2018 |
| WO | WO 2016/017488 A1 | | 2/2016 |
| WO | WO 2016/098570 A1 | | 6/2016 |
| WO | WO 2017/054898 A1 | | 4/2017 |
| WO | WO 2020/008969 A1 | | 1/2020 |

\* cited by examiner

COLOR FILTER, AND METHOD OF MANUFACTURING SAME

CROSS REFERENCE TO RELATED APPLICATION

This application claims the benefit of Korean Patent Application No. KR 10-2018-0100518, filed Aug. 27, 2018, which is hereby incorporated by reference in its entirety into this application.

BACKGROUND OF THE INVENTION

1. Technical Field

The present invention relates to a color filter, a method of manufacturing the same and an image display device including the same.

2. Description of the Related Art

Display devices that have emerged recently include a liquid crystal display, an organic electroluminescent display and the like.

A liquid crystal display (LCD) uses a color filter for color formation, and the color filter is configured to include a black matrix layer, formed in a predetermined pattern on a transparent substrate in order to shield boundaries between individual pixels, and pixel portions of three colors (namely red (R), green (G) and blue (B)) arranged in a predetermined sequence in order to form individual pixels, which are sequentially stacked.

The color filter is manufactured by applying three or more colors on a transparent substrate using a pigment dispersion process, an electrodeposition process, a printing process, a dyeing process, a transfer process, an inkjetting process, etc. These days, a pigment dispersion process using a pigment-dispersion-type photosensitive resin, which is superior in quality and performance, is mainly performed.

A pigment dispersion process is used to form a colored thin film by repeating a series of procedures of applying a photosensitive resin composition including a colorant, an alkali-soluble resin, a photopolymerizable monomer, a photoinitiator, an epoxy resin, a solvent, other additives, and the like on a transparent substrate having a black matrix, exposing a pattern to be formed, removing the unexposed portion with a solvent, and performing thermal curing, and is actively applied to the manufacture of LCDs for mobile phones, laptop computers, monitors, TVs and the like.

In a typical pigment dispersion process, a dye or a pigment is used as a colorant, which causes a problem of decreased transmission efficiency of a light source. Such decreased transmission efficiency consequently lowers the color reproducibility of an image display device, which makes it difficult to realize a high-quality image. Hence, not only superior pattern characteristics but also further improved performance, such as diverse color representation, high color reproduction rate, high luminance and high contrast ratio, are required, and thus the use of self-emitting quantum dots instead of dyes or pigments has been proposed.

When quantum dots are used as a light-emitting material of the color filter, the light emission waveform may be narrowed, and high color realization capability, which cannot be obtained by the pigment, and superior luminance characteristics may be exhibited. However, it has been reported that, due to the low stability of the quantum dots in manufacturing the color filter, crystals are formed on the surface thereof, so that the luminous efficiency of the quantum dots is greatly reduced.

In this regard, for example, Korean Patent Application Publication No. 10-2018-0030353 discloses a quantum-dot color filter for increasing luminous efficiency and a display device including the same, and there is continuous demand for the development of a technique that is capable of minimizing a reduction in luminous efficiency during the manufacture of a self-luminous color filter.

Moreover, a display that is able to reduce power consumption by improving luminous efficiency and has high luminance needs to be continuously developed so that the user can obtain a bright image and can recognize a distinct color.

CITATION LIST

Patent Literature (Patent Document 1) Korean Patent Application Publication No. 10-2018-0030353

SUMMARY OF THE INVENTION

Therefore, the present invention has been made keeping in mind the problems encountered in the related art, and an objective of the present invention is to provide a color filter, which is capable of improving the luminous efficiency of pixels including quantum dots, may ensure a high aperture ratio to thus exhibit improved luminance and a bright image, and may realize low power consumption.

Another objective of the present invention is to provide a method of manufacturing the color filter and an image display device including the color filter.

The present invention provides a color filter, including a color layer having at least one color, a quantum dot layer, and a partition wall in a unitary form for the color layer and the quantum dot layer.

In addition, the present invention provides a method of manufacturing the color filter, the method including forming a partition wall on a base substrate, forming a color layer having at least one color on the base substrate having the partition wall, and forming a quantum dot layer on the color layer.

According to the present invention, a color filter includes a partition wall in a unitary form for a quantum dot layer and a color layer, and thus can exhibit a superior external light suppression effect, thereby improving luminous efficiency.

Also, according to the present invention, it is possible to simplify the process of manufacturing the color filter, thereby improving productivity.

In addition, an image display device includes the color filter, thereby ensuring a high aperture ratio, ultimately exhibiting improved luminance and thus a bright image and realizing a high-quality image and low power consumption.

DESCRIPTION OF SPECIFIC EMBODIMENTS

The present invention pertains to a color filter including a color layer having at least one color, a quantum dot layer, and a partition wall in a unitary form for the color layer and the quantum dot layer, a method of manufacturing the same and an image display device including the same.

In the present invention, the partition wall in a unitary form means a unitary integral partition wall for both the color layer and the quantum dot layer, rather than individual partition walls for the color layer and the quantum dot layer, respectively.

Thereby, according to the present invention, the color filter may exhibit a superior external light suppression effect to thus improve the luminous efficiency thereof, and moreover, the process of manufacturing the color filter may be simplified, thus increasing productivity. In addition, an image display device is capable of ensuring a high aperture ratio by virtue of the partition wall in a unitary form, thereby exhibiting improved luminance and thus a bright image and realizing a high-quality image and lower power consumption.

Hereinafter, a detailed description will be given of preferred embodiments of the present invention with reference to the appended drawings. Before describing the present invention, if it is determined that a detailed description of the related known functions and configurations may unnecessarily obscure the gist of the present invention, a description thereof will be omitted.

The following description and drawings illustrate specific embodiments to enable those skilled in the art to easily implement the described devices and methods. Other embodiments may incorporate other structural and logical variations. Individual components and functions may be generally selected unless explicitly required, and the order of processes may vary. The portions and features of some embodiments may be included in, or replaced with, other embodiments.

<Color Filter>

Figure 1:
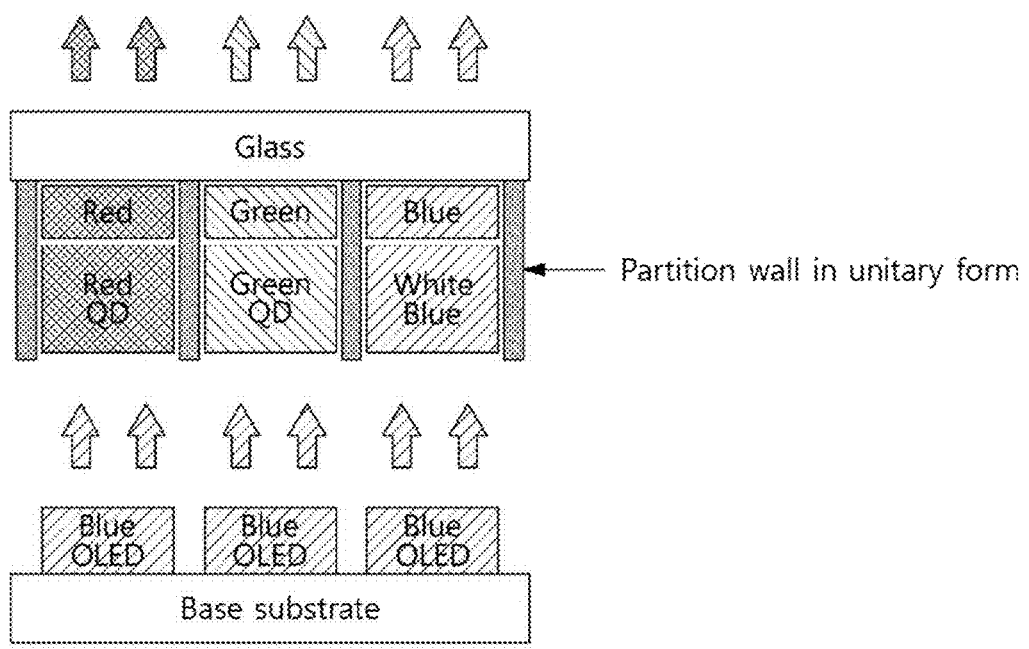
FIGS. 1 and 2 schematically show color filters according to exemplary embodiments of the present invention.
Figure 2:
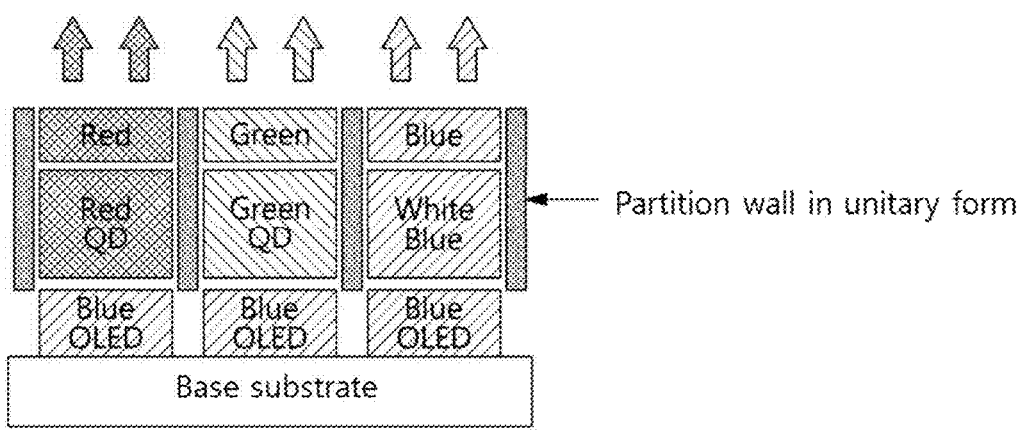

FIG. 1 schematically shows a color filter according to a first embodiment of the present invention, and FIG. 2 schematically shows a color filter according to a second embodiment of the present invention.

With reference to FIGS. 1 and 2, the color filter of the present invention includes a color layer, a quantum dot layer, and a partition wall.

The color layer includes at least one color selected from among red, green, blue and the like, and may be formed using a colored photosensitive resin composition including at least one selected from among a colorant, an alkali-soluble resin, a photopolymerizable compound, a photoinitiator, and a solvent.

The quantum dot layer includes quantum dots, and may be disposed on the color layer.

The quantum dot layer of the present invention may be formed using a self-luminous photosensitive resin composition including at least one selected from photoluminescence quantum dots, an alkali-soluble resin, a photopolymerizable compound, a photoinitiator, and a solvent.

A quantum dot (QD) is a nano-sized semiconductor material. The atoms form molecules, and the molecules form aggregates of small molecules called clusters to form nanoparticles. These nanoparticles are referred to as quantum dots, especially when they have semiconductor characteristics. The quantum dots emit energy corresponding to the energy bandgap thereof when receiving energy from the outside to reach an excited state.

The quantum dots are not particularly limited, so long as they are capable of emitting light upon light stimulation. For example, the quantum dots may be selected from the group consisting of a Group II-VI semiconductor compound, a Group III-V semiconductor compound, a Group IV-VI semiconductor compound, a Group IV element or compound including the same, and combinations thereof. These may be used alone or in combinations of two or more thereof.

The Group II-VI semiconductor compound may be selected from the group consisting of a binary compound selected from the group consisting of CdS, CdSe, CdTe, ZnS, ZnSe, ZnTe, ZnO, HgS, HgSe, HgTe, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe and mixtures thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and mixtures thereof. The Group III-V semiconductor compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The Group IV-VI semiconductor compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe and mixtures thereof. The Group IV element or compound including the same may be selected from the group consisting of a unary compound selected from the group consisting of Si, Ge, and mixtures thereof; and a binary compound selected from the group consisting of SiC, SiGe, and mixtures thereof.

Also, the quantum dots may have a homogeneous single structure, a dual structure such as a core-shell structure, a gradient structure, etc., or a mixed structure thereof.

In the core-shell dual structure, respective materials for the core and the shell may be different semiconductor compounds mentioned above. For example, the core may include, but is not limited to, at least one selected from the group consisting of CdSe, CdS, ZnS, ZnSe, CdTe, CdSeTe, CdZnS, PbSe, AgInZnS and ZnO. The shell may include, but is not limited to, at least one selected from the group consisting of CdSe, ZnSe, ZnS, ZnTe, CdTe, PbS, TiO, SrSe and HgSe.

The quantum dots of the present invention may include red quantum dots, green quantum dots and blue quantum dots. The quantum dot layer according to the present invention may include any one kind of quantum dots selected from among red, green, blue and combinations thereof so as to correspond to the color of the color layer.

For example, in the case where blue light is emitted from a backlight unit, when blue light is incident on the quantum dot layer existing at a position corresponding to the red color layer, the blue light is converted into red light by the quantum dot layer. When blue light is incident on the quantum dot layer existing at a position corresponding to the green color layer, the blue light is converted into green light by the quantum dot layer. Thus, the quantum dot layer of the present invention is a color conversion layer that converts incident light into light of the same color as that of the color layer.

The quantum dot layer may include scattering particles that scatter incident light. The quantum dot layer including scattering particles causes incident light to be emitted without color conversion. When blue light is incident on the quantum dot layer including scattering particles, the incident blue light is emitted without color conversion.

As the scattering particles, all of typical inorganic materials may be used, and a metal oxide is preferably used.

The metal oxide may be an oxide of at least one metal selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pr, Nd, Pm, Sm, Eu, Gd, Tb, Dy, Ho, Er, Tm, Yb, Ti, Sb, Sn, Zr, Nb, Ce, Ta, In and combinations thereof.

Specifically, the metal oxide may include at least one selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO—Al, $Nb_2O_3$, SnO, MgO and combinations thereof. If necessary, a material that is surface-treated with a compound having an unsaturated bond such as acrylate may be used.

The quantum dots may be synthesized through a wet chemical process, a metal organic chemical vapor deposition process, or a molecular beam epitaxy process.

The wet chemical process is a method of growing particles by adding a precursor material to an organic solvent. When the crystal grows, the organic solvent is naturally coordinated to the surface of the quantum dot crystal and thus acts as a dispersant to regulate crystal growth. Thereby, the growth of nanoparticles may be controlled through an easier and cheaper process than vapor deposition, such as metal organic chemical vapor deposition (MOCVD) or molecular beam epitaxy (MBE).

The quantum dots are capable of imparting the color filter with further improved performance, such as diverse color representation, high color reproduction rate, high luminance, and high contrast ratio, in lieu of conventional colorants such as pigments, dyes, etc. However, these quantum dots emit light in all directions, undesirably incurring a problem in which the utilization rate of light is not high.

The color filter of the present invention is configured to include the partition wall in a unitary form for the color layer and the quantum dot layer, particularly for pixel regions of the multilayer structure, in which the quantum dot layer is stacked on the color layer, thereby increasing the luminous efficiency of the color filter.

The partition wall is positioned between the pixel regions of the multilayer structure on the base substrate.

The partition wall may be formed using a photosensitive resin composition including, for example, an alkali-soluble resin, a photopolymerizable compound, a photoinitiator, and a solvent.

In the color filter of the present invention, the base substrate may be a substrate of the color filter itself, as shown in FIG. 1, or may be a portion where the color filter is positioned in a display device, etc., but is not particularly limited. The substrate may be glass, silicon (Si), silicon oxide ($SiO_x$) or a polymer substrate. The polymer substrate may be polyethersulfone (PES) or polycarbonate (PC).

The color filter of the present invention is configured such that the partition wall is formed on the base substrate and the color layer and the quantum dot layer are formed on regions partitioned by the partition wall through an inkjetting process or a lithography process. When the inkjetting process is used to form the quantum dot layer on the color layer, the manufacturing process may be simplified and material loss may be reduced.

In some embodiments, the partition wall may have a height of 5 to 15 μm. If the height of the partition wall is less than 5 μm, the color layer and the quantum dot layer are not sufficiently thick, making it difficult to exhibit desired properties. On the other hand, if the height thereof exceeds 15 μm, it is difficult to form uniform coating films of the color layer and the quantum dot layer.

Moreover, the color filter of the present invention may be configured such that the quantum dot layer is formed thicker than the color layer. For example, the quantum dot layer adjacent to the partition wall may be formed 100 to 600% as thick as the color layer adjacent to the partition wall. When the thickness of the quantum dot layer falls within the above range, the luminous efficiency of the color filter may be desirably improved.

In an embodiment of the present invention, it is preferred that the color layer be formed to a thickness of 5 μm or less and that the quantum dot layer be formed to a thickness of 5 μm or more.

The color filter according to the present invention described above may be applied to a display so as to show the color.

For example, the color filter according to an embodiment of the present invention may be configured such that color filter regions are disposed so as to correspond to respective pixel regions of a display unit controlled in response to an image signal, thereby realizing color formation. The display unit may be, for example, a transmissive or reflective liquid crystal panel or an organic light-emitting panel.

<Method of Manufacturing Color Filter>

Below is a description of the method of manufacturing the color filter according to an embodiment of the present invention.

The color filter may be manufactured by forming a partition wall in a unitary form, forming a color layer, and forming a quantum dot layer on the color layer. Alternatively, in some cases, forming a partition wall in a unitary form, forming a quantum dot layer, and then forming a color layer may be carried out.

For example, the method of manufacturing the color filter according to an embodiment of the present invention may include forming a partition wall in a unitary form on a base substrate, forming a color layer having at least one color on the base substrate having the partition wall, and forming a quantum dot layer on the color layer.

Alternatively, the method of manufacturing the color filter according to an embodiment of the present invention may include forming a partition wall in a unitary form on a backlight unit, forming a quantum dot layer on the backlight unit having the partition wall, and forming a color layer having at least one color on the quantum dot layer.

The color filter thus manufactured may be a filter that is provided with the partition wall in a unitary form, and includes both the quantum dot layer and the color layer.

In the present invention, the partition wall may be manufactured using a process of forming a partition wall included in a conventional color filter.

For example, the partition wall for use in the color filter according to the present invention may be formed in a manner in which a resin layer is formed on at least one side of the substrate or backlight unit using a photosensitive resin composition including a colorant, an alkali-soluble resin, a photopolymerizable compound, a photoinitiator and a solvent, and the resin layer is exposed and developed in a pattern to thereby form a partition wall pattern that separates the quantum dot layer and the color layer. Additional processes, such as a baking process, etc., may be further included as needed.

The color layer and the quantum dot layer may be formed on regions partitioned by the partition wall thus manufactured, according to the conventional method of manufacturing the color filter, and the formation process thereof is similar to the process of forming the partition wall described above, except that the shape of the mask that is used is different. Since the partition wall is formed through an additional introduction process, it is possible to form the color layer or the quantum dot layer on the regions partitioned by the partition wall using an inkjetting process, rather than a spin-coating process. The use of the inkjetting process has the advantage of reducing material loss.

<Image Display Device>

The present invention pertains to an image display device including the color filter.

The color filter of the present invention is applicable to a variety of image display devices, such as electroluminescent display devices, plasma display devices, field emission display devices, and the like, as well as typical liquid crystal display devices.

The image display device of the present invention may include the color filter including the color layer having at least one color, the quantum dot layer, and the partition wall in a unitary form for the color layer and the quantum dot layer. In this case, although the light emitted by a light source applied to the image display device is not particularly limited, a light source that emits blue light is preferably used in view of superior color reproducibility.

The image display device of the present invention exhibits superior luminous efficiency, ultimately manifesting high luminance, superior color reproducibility, and a wide viewing angle.

A better understanding of the present invention will be given through the following examples and comparative example. However, the following examples are merely set forth to illustrate the present invention but are not to be construed as limiting the present invention, and may be variously modified and altered. The scope of the present invention will be determined by the technical spirit of the accompanying claims.

EXAMPLES AND COMPARATIVE EXAMPLE

Manufacture of Color Filter

A glass substrate having a size of 10 cm (width)×10 cm (length) (Eagle 2000, made by Corning) was cleaned with a neutral detergent, water and an alcohol, in that order, and then dried. In order to form a partition wall on the glass substrate, the glass substrate was spin-coated with SY-LR1001 available from Dongwoo Fine-Chem and then prebaked in a clean oven at 90° C. for 3 min. The prebaked substrate was cooled to room temperature and then irradiated with light at a dose of 60 mJ/cm$^2$ (at 365 nm) at an interval of 200 μm with a photomask made of quartz glass using an exposure machine (TME-150RSK, made by Topcon). Here, the irradiation was performed using light emitted from an ultrahigh-pressure mercury lamp. Here, the photomask that was used was a photomask in which a pattern was formed in the same plane. A conventional mask for forming a black matrix has a blocking portion (unexposed portion) having a rectangular shape therein, and the light-transmitting portion (pattern) thereof has a form in which straight lines cross each other. The pattern size of the light-transmitting portion was 15 μm. After irradiation with light, the coating film was developed through immersion at 25° C. for 100 sec in an aqueous developing solution containing 0.12 wt % of a nonionic surfactant and 0.04 wt % of potassium hydroxide, washed with water, and post-baked in an oven at 220° C. for 20 min. The film thus obtained had a thickness of 13 μm. The film thickness was measured using a film thickness meter (DEKTAK 6M, made by Veeco).

Here, the coating film for the color layer formed in each of Examples 1 and 2 and Comparative Example 1 had a thickness of 2.0 μm, and the coating film for the quantum dot layer had a thickness of 11.0 μm.

In Example 1, the color filter was manufactured using the partition wall in a unitary form, as shown in FIG. 1.

In Example 2, the color filter was manufactured using the partition wall in a unitary form, as shown in FIG. 2.

Figure 3:
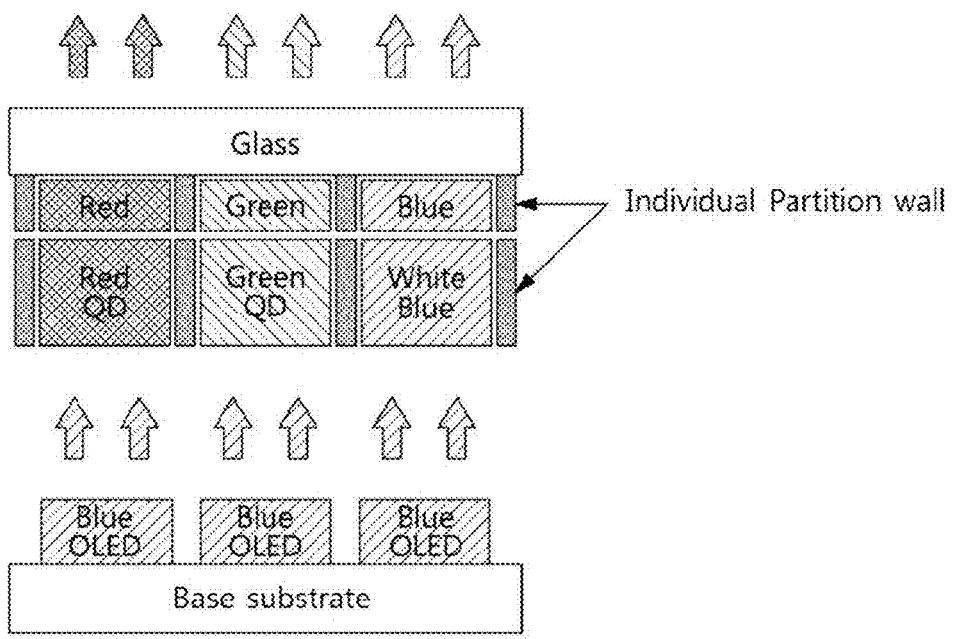
FIG. 3 schematically shows a color filter of Comparative Example according to the present invention.

In Comparative Example 1, the color filter was manufactured by forming a partition wall and a color layer and forming a partition wall and a quantum dot layer, as shown in FIG. 3. The color filter thus manufactured includes individual partition walls for the color layer and the quantum dot layer, respectively.

TEST EXAMPLE

Evaluation of Properties of Color Filter

Test Example 1

Measurement of Luminance

The color filter manufactured in each of Examples 1 and 2 and Comparative Example 1 was assembled with an OLED panel, and the luminance thereof was measured at a pinhole diameter of 100 μm using a microscopic spectrophotometer (OSP100, made by Olympus Corporation). The results are shown in Table 1 below.

Test Example 2

Evaluation of Aperture Ratio

The aperture ratio of the color filter manufactured in each of Examples 1 and 2 and Comparative Example 1 was determined by calculating the light-emitting area relative to the entire area. The results are shown in Table 1 below.

TABLE 1

| | Luminance (Y) | Aperture ratio (%) |
|---|---|---|
| Example 1 | 87 | 88 |
| Example 2 | 89 | 88 |
| Comparative Example 1 | 78 | 83 |

As is apparent from Table 1, the color filter having the partition wall as in Examples 1 and 2 exhibited high luminance, and moreover, it was confirmed that the partition wall in a unitary form was capable of reducing the aperture ratio loss in the formation of the color layer and the quantum dot layer.

In contrast, in the color filter not including the partition wall in a unitary form, as in Comparative Example 1, poor luminance and great aperture ratio loss resulted, unlike the Examples.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A color filter, comprising:
a color layer having at least one color;
a quantum dot layer; and
a partition wall in a unitary form for the color layer and the quantum dot layer, wherein the partition wall in the unitary form is characterized in that it is directly formed on a backlight unit, and
wherein the backlight unit is an OLED.

2. The color filter of claim 1, wherein the partition wall has a height of 5 μm to 15 μm.

3. The color filter of claim 1, wherein the color layer having at least one color and the quantum dot layer are formed using an inkjetting process.

4. The color filter of claim 1, wherein a thickness of the quantum dot layer adjacent to the partition wall is 100% to 600% of a thickness of the color layer adjacent to the partition wall.

5. The color filter of claim 1, wherein the quantum dot layer includes scattering particles.

6. The color filter of claim 5, wherein the scattering particles include at least one selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO—Al, $Nb_2O_3$, SnO and MgO.

7. A method of manufacturing the color filter of claim 1, the method comprising:
forming a partition wall in a unitary form on a backlight unit;
forming a quantum dot layer on the backlight unit having the partition wall; and
forming a color layer having at least one color on the quantum dot layer.

8. The method of claim 7, wherein the color layer having at least one color and the quantum dot layer are formed using an inkjetting process.

9. The method of claim 7, wherein the quantum dot layer includes scattering particles, and the scattering particles include at least one selected from the group consisting of $Ta_2O_5$, $Ti_3O_5$, IZO, ZnO—Al, $Nb_2O_3$ and SnO.

10. The method of claim 7, wherein the partition wall in the unitary form is a single partition wall.

11. The method of claim 7, wherein the partition wall directly formed on the backlight unit is devoid of an intermediary structure between the partition wall and the backlight unit.

12. The color filter of claim 5, wherein the scattering particles include at least one selected from the group consisting of $Ta_2O_5$, $Ti_3O_5$, IZO, ZnO—Al, $Nb_2O_3$ and SnO.

13. The color filter of claim 1, wherein the partition wall in the unitary form is a single partition wall.

14. The color filter of claim 1, wherein the partition wall directly formed on the backlight unit is devoid of an intermediary structure between the partition wall and the backlight unit.

15. The method of claim 7, wherein the forming of the color layer is formed using an inkjetting process.

16. The method of claim 7, wherein the forming of the quantum dot layer is formed using an inkjetting process.

* * * * *